US009720772B2

(12) United States Patent
Sukegawa et al.

(10) Patent No.: US 9,720,772 B2
(45) Date of Patent: Aug. 1, 2017

(54) MEMORY SYSTEM, METHOD FOR CONTROLLING MAGNETIC MEMORY, AND DEVICE FOR CONTROLLING MAGNETIC MEMORY

(71) Applicant: KABUSHIKI KAISHA TOSHIBA, Minato-ku (JP)

(72) Inventors: Hiroshi Sukegawa, Nerima (JP); Hiroshi Yao, Yokohama (JP); Kohsuke Harada, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 96 days.

(21) Appl. No.: 14/796,294

(22) Filed: Jul. 10, 2015

(65) Prior Publication Data

US 2016/0259688 A1    Sep. 8, 2016

Related U.S. Application Data

(60) Provisional application No. 62/128,123, filed on Mar. 4, 2015.

(51) Int. Cl.
*G11B 5/00* (2006.01)
*G06F 11/10* (2006.01)
*G11C 19/08* (2006.01)
*B82Y 25/00* (2011.01)

(52) U.S. Cl.
CPC ...... *G06F 11/1076* (2013.01); *G11C 19/0808* (2013.01); *G11C 19/0841* (2013.01); *G11C 19/0866* (2013.01); *G11C 19/0875* (2013.01); *B82Y 25/00* (2013.01)

(58) Field of Classification Search
None
See application file for complete search history.

(56) References Cited

U.S. PATENT DOCUMENTS

| 5,603,001 | A | 2/1997 | Sukegawa et al. |
| 2002/0184592 | A1 | 12/2002 | Koga et al. |
| 2003/0101405 | A1 | 5/2003 | Shibata |
| 2004/0113138 | A1* | 6/2004 | DeHon ............... B82Y 10/00 257/9 |
| 2007/0004222 | A1* | 1/2007 | Wei ................. B82Y 30/00 438/775 |

(Continued)

FOREIGN PATENT DOCUMENTS

| JP | 07-302175 | 11/1995 |
| JP | 07-302176 | 11/1995 |

*Primary Examiner* — Daniel McMahon
(74) *Attorney, Agent, or Firm* — Oblon, McClelland, Maier & Neustadt, L.L.P.

(57) ABSTRACT

A memory system according to an embodiment includes a plurality of magnetic nanowires, a read unit that reads data from the magnetic nanowires, a shift control unit that shifts domain walls in the magnetic nanowires, and a read control unit. The read control unit is configured to control the read unit to read the data from the magnetic nanowires in parallel, store two or more of the data read in parallel, and when the data corresponding to a first magnetic nanowire of the magnetic nanowires are delayed or advanced as compared to the data corresponding to a second magnetic nanowire of the magnetic nanowires, determines a misalignment in the data and correct the data based on the misalignment.

20 Claims, 10 Drawing Sheets

(56) References Cited

U.S. PATENT DOCUMENTS

| | | | |
|---|---|---|---|
| 2007/0262301 A1* | 11/2007 | Cowburn | B82Y 10/00 257/40 |
| 2008/0032233 A1* | 2/2008 | Wu | B82Y 10/00 430/296 |
| 2008/0278998 A1* | 11/2008 | Cowburn | G11C 19/0808 365/171 |
| 2009/0073009 A1 | 3/2009 | Oda | |
| 2010/0014187 A1* | 1/2010 | Winarski | B82Y 10/00 360/75 |
| 2010/0124091 A1* | 5/2010 | Cowburn | B82Y 10/00 365/80 |
| 2010/0128510 A1* | 5/2010 | Cowburn | B82Y 10/00 365/80 |
| 2011/0278539 A1* | 11/2011 | Bangsaruntip | B82Y 10/00 257/14 |
| 2012/0246542 A1 | 9/2012 | Moyer et al. | |
| 2012/0290901 A1 | 11/2012 | Kong et al. | |

\* cited by examiner

MEMORY SYSTEM, METHOD FOR CONTROLLING MAGNETIC MEMORY, AND DEVICE FOR CONTROLLING MAGNETIC MEMORY

CROSS REFERENCE TO RELATED APPLICATIONS

This application is based upon and claims the benefit of priority from the prior provisional Application 62/128,123 filed on Mar. 4, 2015 in USA, the entire contents of which are incorporated herein by reference.

FIELD

Embodiments described herein relate to memory systems, magnetic memory control methods, and magnetic memory control devices.

BACKGROUND

Domain wall moving type magnetic memories are known. These memories include a plurality of magnetic nanowires, and a write element and a read element disposed on predetermined positions for the respective magnetic nanowires to perform a write operation and a read operation. Each magnetic nanowire is divided into a plurality of magnetic domains by domain walls. The directions of magnetization in the magnetic domains correspond to "0" data and "1" data. The domain walls are moved by a current flowing through each magnetic nanowire in a direction in which the magnetic nanowire extends, thereby moving the magnetic domains. As a result, the data stored in a specific magnetic domain is moved to be used by the write element or read element at the predetermined position to perform a write operation or read operation. In the write operation or read operation, the domain walls of the magnetic nanowires are moved in a parallel manner.

The movement rates of the domain walls moved in parallel differ for the respective magnetic nanowires. As a result, the time at which the target data can be obtained differs in each magnetic nanowire. If, however, the movement of domain walls is controlled in each magnetic nanowire, the memory structure becomes complicated. This makes it difficult to provide inexpensive memory chips.

DETAILED DESCRIPTION

A memory system according to an embodiment includes: a plurality of magnetic nanowires; a read unit configured to read data from the magnetic nanowires; a shift control unit configured to shift domain walls in the magnetic nanowires; and a read control unit configured to cause the read unit to read the data from the magnetic nanowires in parallel, store two or more of the data read in parallel, determine a misalignment in the data when the data corresponding to a first magnetic nanowire of the magnetic nanowires are delayed or advanced as compared to the data corresponding to a second magnetic nanowire of the magnetic nanowires, and correct the stored data based on the determined misalignment.

Embodiments will now be explained with reference to the accompanying drawings.

Figure 1:
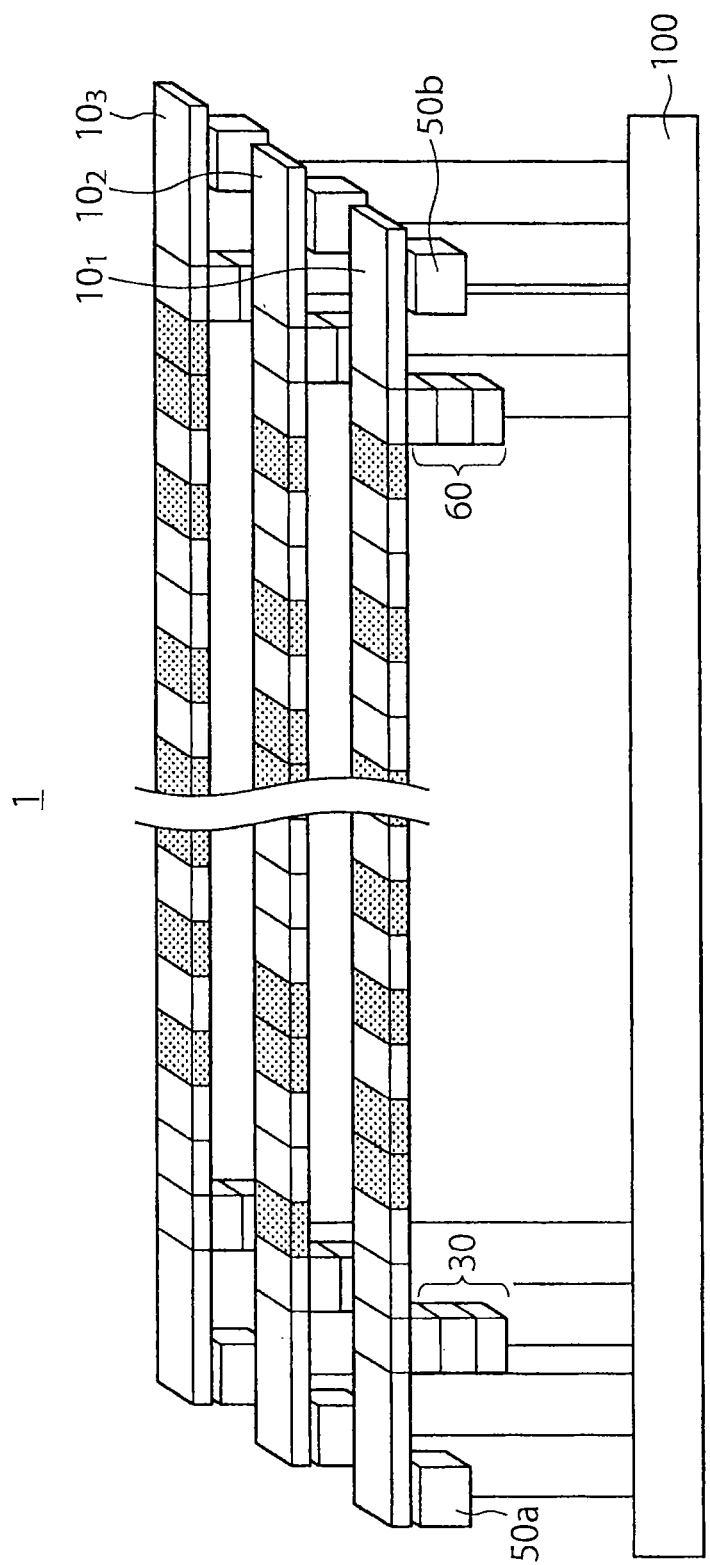
FIG. 1 is a diagram showing the structure of a magnetic memory system according to an embodiment.

FIG. 1 shows a magnetic memory system ("memory system") according to an embodiment. The magnetic memory system according to this embodiment includes a domain wall moving type memory 1 and a control device 100. The memory system operates as, for example, an external storage device for a host device that is not shown in FIG. 1. The host device may be, for example, an information processing device such as a personal computer, a tester device, a manufacturing device, an imaging device such as a still camera or video camera, a portable terminal such as a tablet computer or smartphone, a game machine, or a car-mounted terminal such as a car navigation system. The host device and the memory system communicate with each other in accordance with a given interface standard. The host device sends an access request (such as a write request or a read request) to the memory system. The interface standard may be, for example, Serial Advanced Technology Attachment (SATA), PCI Express (PCIe), or Serial Attached SCSI (SAS).

The domain wall moving type memory 1 includes N (N≥1) magnetic nanowires $10_1$, $10_2$, $10_3$ disposed above a substrate (not shown), on which an integrated circuit is mounted, the magnetic nanowires being in parallel with each other and functioning as storage elements, write units 30 each corresponding to one of the magnetic nanowires $10_i$ (i=1, 2, 3), pairs of electrodes 50a, 50b for shifting bits, each pair being disposed to one of the magnetic nanowires $10_i$ (i=1, 2, 3), and read units 60 each corresponding to one of the magnetic nanowires $10_i$ (i=1, 2, 3). The control device 100 may or may not be disposed on the same substrate as the one on which the domain wall moving type memory 1 is disposed.

Figure 2:
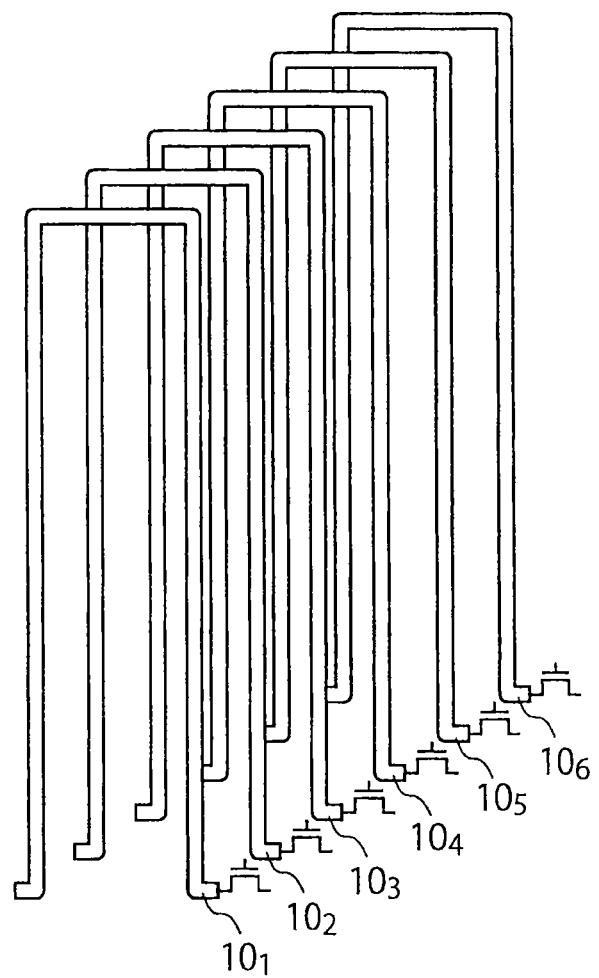
FIG. 2 is a diagram showing an example of magnetic nanowires used in the magnetic memory system according to the embodiment.

The magnetic nanowires $10_i$ (i=1, 2, 3) extend in one direction. This means that the respective magnetic nanowires $10_i$ (i=1, 2, 3) may locally extend in one direction, but does not necessarily mean that the magnetic nanowires $10_i$ (i=1, 2, 3) should globally extend in one direction. For example, the magnetic nanowires $10_i$ (i=1, 2, 3, 4, 5, 6) may be disposed above a substrate, and may include first portions extending upward from near the substrate, second portions that connect to the first portions and are in parallel with the substrate, and third portions connecting to the second portions and extending downward from the second portions, like a domain wall moving type memory according to a specific example shown in FIG. 2. In this case, the respective portions of the magnetic nanowires $10_i$ (i=1, 2, 3, 4, 5, 6) locally extend in one direction, but the entire portions do not extend in one direction. It is determined herein that the respective magnetic nanowires $10_i$ (i=1, 2, 3, 4, 5, 6) in the above case also extend in one direction.

The easy magnetization axis (perpendicular magnetic anisotropy) of the magnetization of each magnetic nanowire is perpendicular to a plane formed by the long side of the magnetic nanowire extending in the longitudinal direction and the long side of a cross section of the magnetic nanowire, the cross section being perpendicular to the longitudinal direction of the magnetic nanowire. If the cross section of each magnetic nanowire, is square, the long side thereof may be any side of the square. Each magnetic nanowire has a plurality of magnetic domains and a plurality of domain walls partitioning the magnetic domains. The direction of magnetic moment (magnetization) in each magnetic domain is determined to correspond to the data (bit) "1" or "0." Data are stored in the magnetic domains in this manner. For example, the data "1" is stored in each dotted region and the data "0" is stored in each white region in FIG. 1. Each domain wall is present between adjacent regions storing different data, but is not present between adjacent regions storing the same data.

The cross section of each magnetic nanowire may be, for example, rectangular, square, oval, or circular. Although the width of each magnetic nanowire is the same in FIG. 1, the width may change at regular intervals.

The positions of the domain walls in each magnetic nanowire can be shifted by causing a shift current Is to flow between the electrodes $50a$, $50b$. This means that data moved on the magnetic nanowire. The domain walls move in the opposite direction to the direction of the shift current Is, i.e., in the direction of the electron current.

The magnetic nanowires may be formed of, for example, (1) a random alloy, (2) an ordered alloy, and (3) a ferrimagnetic material.

Ordered Alloy

The ordered alloy may contain at least one element selected from the group consisting of Fe, Co, and Ni, and at least one element selected from the group consisting of Pt and Pd. For example, if the crystal structure of an ordered alloy is of $L1_0$ type, such alloys as $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$ may be employed. The composition ratio of the ordered alloy is not limited to the above ones. An impurity element such as Cu, Cr, or Ag may be added to the ordered alloy to adjust the magnetic anisotropy energy and the saturation magnetization. Great magnetic anisotropy energy may be easily obtained in this manner.

Ferrimagnetic Material

An example of ferrimagnetic material is an alloy of a rare earth metal and a transition metal, like an amorphous alloy containing at least one rare earth metal selected from the group consisting of terbium (Tb), dysprosium (Dy), and gadolinium (Gd), and at least one transition metal selected from the group consisting of Fe, Co, and Ni. Specific examples include TbFe, TbCo, TbFeCo, DyTbFeCo, GdTbCo, and GdFeCo. The magnetic anisotropy energy and the saturation magnetization of these alloys may be adjusted by adjusting the compositions thereof. The amorphous alloy may contain some fine crystals. The magnetic nanowires 10 are preferably formed of a ferrimagnetic material with which a low saturation magnetization may be obtained. If the saturation magnetization is reduced, the current needed for moving the domain walls may be reduced.

The materials of (1) to (3) are combined to form the magnetic nanowires 10. For example, the domain wall characteristics may be adjusted by the combinations of TbFeCo/NiFe and GdFeCo/CoFeB. The magnetic nanowires 10 may also be formed by stacking layers of ferrimagnetic materials with different compositions. The apparent saturation magnetization may be reduced by stacking a rare earth-rich rare earth-transition metal amorphous alloy and a transition metal-rich rare earth-transition metal amorphous alloy. Such stacked layers forming the magnetic nanowires 10 may reduce the current needed for moving the domain walls.

(Write Operation of Domain Wall Moving Type Memory)

Figure 3A:
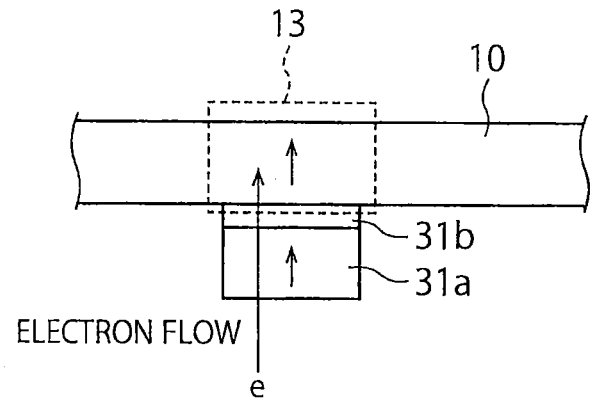
FIGS. 3A and 3B are diagrams showing a write unit in the magnetic memory system according to the embodiment.

The write operation of the domain wall moving type memory 1 according to the embodiment will be described below with reference to FIGS. 3A and 3B.

The write unit 30 is disposed for each magnetic nanowire 10. A target cell (cell with an address for a write operation) 13 of a corresponding magnetic nanowire 10 is moved to the location of the write unit 30 by causing a shift current to flow through the corresponding magnetic nanowire 10 by means of the electrodes $50a$, $50b$ shown in FIG. 1. A data is written to the target cell 13 by setting the magnetization direction thereof. Spin torque writing as shown in FIGS. 3A and 3B may be employed in the write unit 30. A magnetic electrode $31a$ is disposed so as to be in contact with the magnetic nanowire 10 via an intermediate layer $31b$ as shown in FIGS. 3A and 3B. The intermediate layer $31b$ is a nonmagnetic metal layer, a nonmagnetic semiconductor layer, or a tunnel barrier layer.

The magnetization direction of the magnetic electrode $31a$ is perpendicular to the film plane of the intermediate layer $31b$. The film plane herein means the interface of the intermediate layer $31b$ with the magnetic electrode $31a$, which extends in the direction in which the magnetic nanowire 10 extends. During the write operation, an electron current (that flows in the opposite direction to the electric current) is caused to flow between the magnetic nanowire 10 and the magnetic electrode $31a$. The direction of the electron current determines the magnetization direction of the target cell 13, thereby writing data to the target cell 13. FIG. 3A shows a write operation in which the magnetization direction of the target cell 13 is caused to be in parallel with the magnetization direction of the magnetic electrode $31a$. In this case, the electron current is caused to flow from the magnetic electrode $31a$ to the target cell 13 of the magnetic nanowire 10 via the intermediate layer $31b$.

Figure 3B:
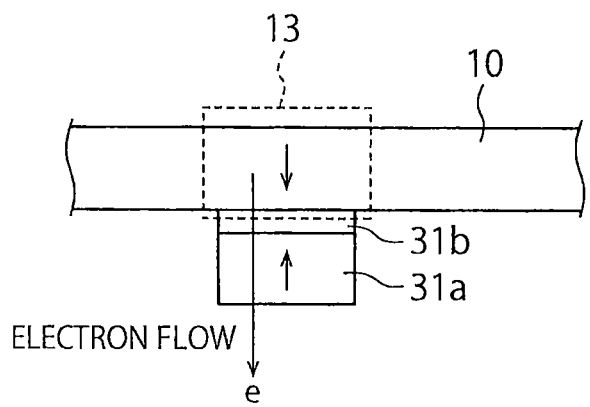

FIG. 3B shows a write operation in which the magnetization direction of the target cell 13 is caused to be in antiparallel with the magnetization direction of the magnetic electrode $31a$. In this case, the electron current is caused to flow from the target cell 13 of the magnetic nanowire 10 to the magnetic electrode $31a$ via the intermediate layer $31b$.

The nonmagnetic metal layer serving as the intermediate layer $31b$ of the write unit 30 may be formed of Cu, Ag, Au, or Al, or an alloy containing at least one of these materials. If the intermediate layer $31b$ is a tunnel barrier layer, it may be formed of an aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, or $Cr_2O_3$. The intermediate layer 31*b* may also be formed of a nonmagnetic material such as graphite.

The magnetic electrode 31*a* of the write unit 30 may be formed of the same material as the magnetic nanowire.

(Read Operation of Domain Wall Moving Type Memory)

The read operation of the domain wall moving type memory according to the embodiment will be described with reference to FIGS. 4A to 4D.

Figure 4A:
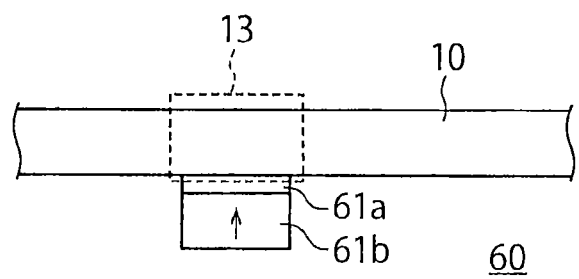
FIGS. 4A to 4D are diagrams showing examples of read unit.

As shown in FIG. 1, each magnetic nanowire $10_i$ (i=1, 2, 3) includes a read unit 60. A target cell (cell with an address for read operation) 13 of a corresponding magnetic nanowire 10 is moved to the location of the read unit 60 by causing a shift current to flow through the corresponding magnetic nanowire 10 by the electrodes 50*a*, 50*b* shown in FIG. 1. The read unit 60 reads the magnetization direction of the bit moved to the corresponding location (target cell 13) of the magnetic nanowire. The read unit 60 may include a magnetic electrode 61*b* that is in contact with the magnetic nanowire 10 via a tunnel barrier layer 61*a*, as shown in FIG. 4A. This may lead to a tunnel magnetoresistance effect (TMR) to read signals. The tunnel barrier layer 61*a* may be formed of such materials as an aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, $Cr_2O_3$, and graphite. The magnetic electrode 61*b* may be formed of the same materials as the magnetic nanowire.

Figure 4B:
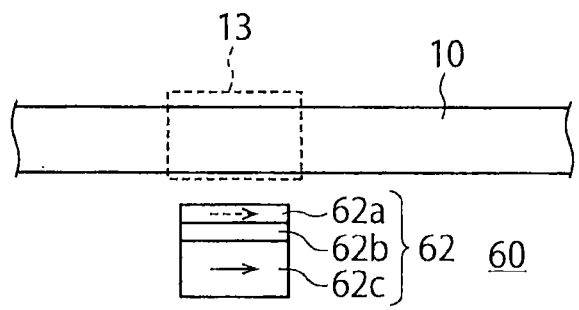

The read unit 60 may be a TMR element 62 serving as a sensor, which is disposed to a location electrically independent of the magnetic nanowire 10 as shown in FIG. 4B. The TMR element 62 has a structure in which a tunnel barrier layer 62*b* is sandwiched between a magnetic layer 62*a* and a magnetic electrode 62*c* with the magnetic layer 62*a* being disposed on the side of the magnetic nanowire 10. The TMR element 62 may have common in-plane magnetization films if it is located obliquely above or below the magnetic nanowire 10 in a cross-sectional view transversely cutting the magnetic nanowire 10. The TMR element 62 may be disposed on a side of the magnetic nanowire 10 at a distance therefrom. In this case, the TMR element 62 preferably has a perpendicular magnetization.

Figure 4C:
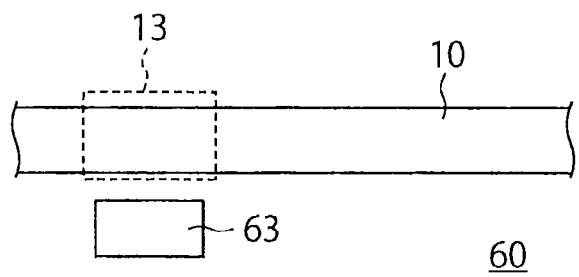
Figure 4D:
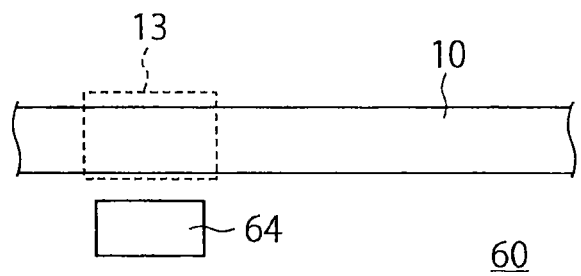

A detection line 63, which is at a distance from the magnetic nanowire 10 as shown in FIG. 4C, may be disposed to the read unit 60 so that the magnetization direction of the target cell 13 may be read using the electromotive force induced in the detection line 63 when the domain walls are moved. Furthermore, a spin wave transmission line 64 may be disposed at a distance from the magnetic nanowire 10 as shown in FIG. 4D so that the magnetization direction of the target cell 13 may be read as a spin wave signal. Moreover, a non-local method may also be employed in the read operation.

(Operation of Control Device)

Figure 5:
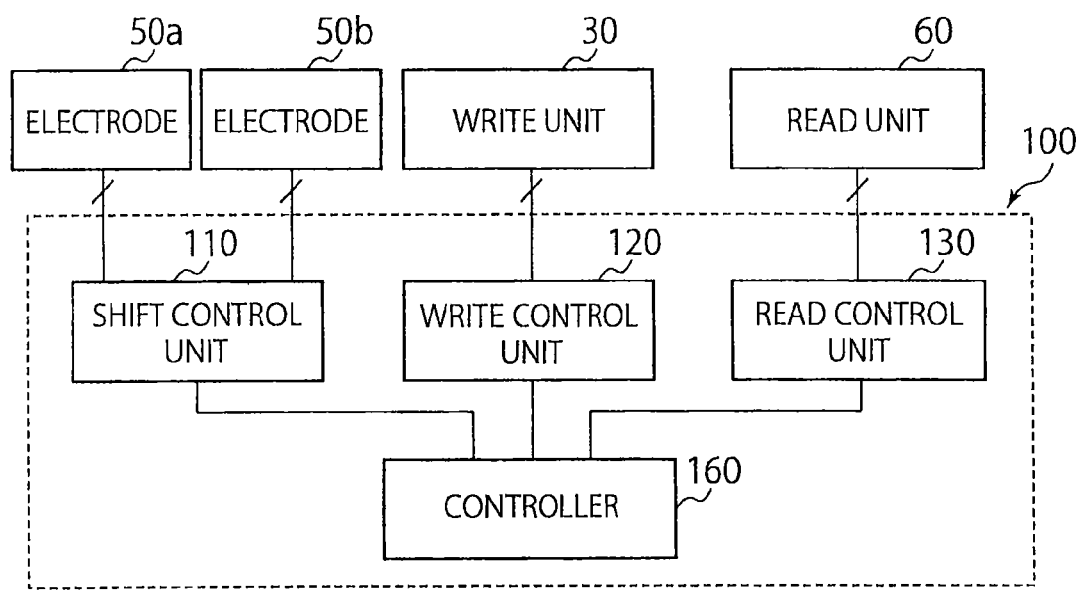
FIG. 5 is a diagram showing the structure of a control device.

The structure and the operation of the control device 100 shown in FIG. 1 will be described below with reference to FIGS. 5 to 13. FIG. 5 is a block diagram showing the structure of the control device 100. The control device 100 includes a shift control unit 110, a write control unit 120, a read control unit 130, and a controller 160.

The shift control unit 110 causes a shift current to flow between the electrodes 50*a*, 50*b* of each of the magnetic nanowires $10_1$-$10_3$ based on a command from the controller 160 in a write operation or a read operation, so that the target cell of each of the magnetic nanowires $10_1$-$10_3$ moves to the location where the write unit 30 or read unit 60 is present.

The shift current is generally a pulse current. For example, one pulse of the shift current moves the target cell by one bit.

The write control unit 120 causes a write current to flow through the write unit 30 of each of the magnetic nanowires $10_1$-$10_3$ based on a command from the controller 160 in a write operation so as to write data to the target cell of each of the magnetic nanowires $10_1$-$10_3$.

The read unit 130 causes a read current to flow through the read unit 60 of each of the magnetic nanowires $10_1$-$10_3$ based on a command from the controller. 160 in a read operation so as to read data from the target cell of each of the magnetic nanowires $10_1$-$10_3$.

Figure 6:
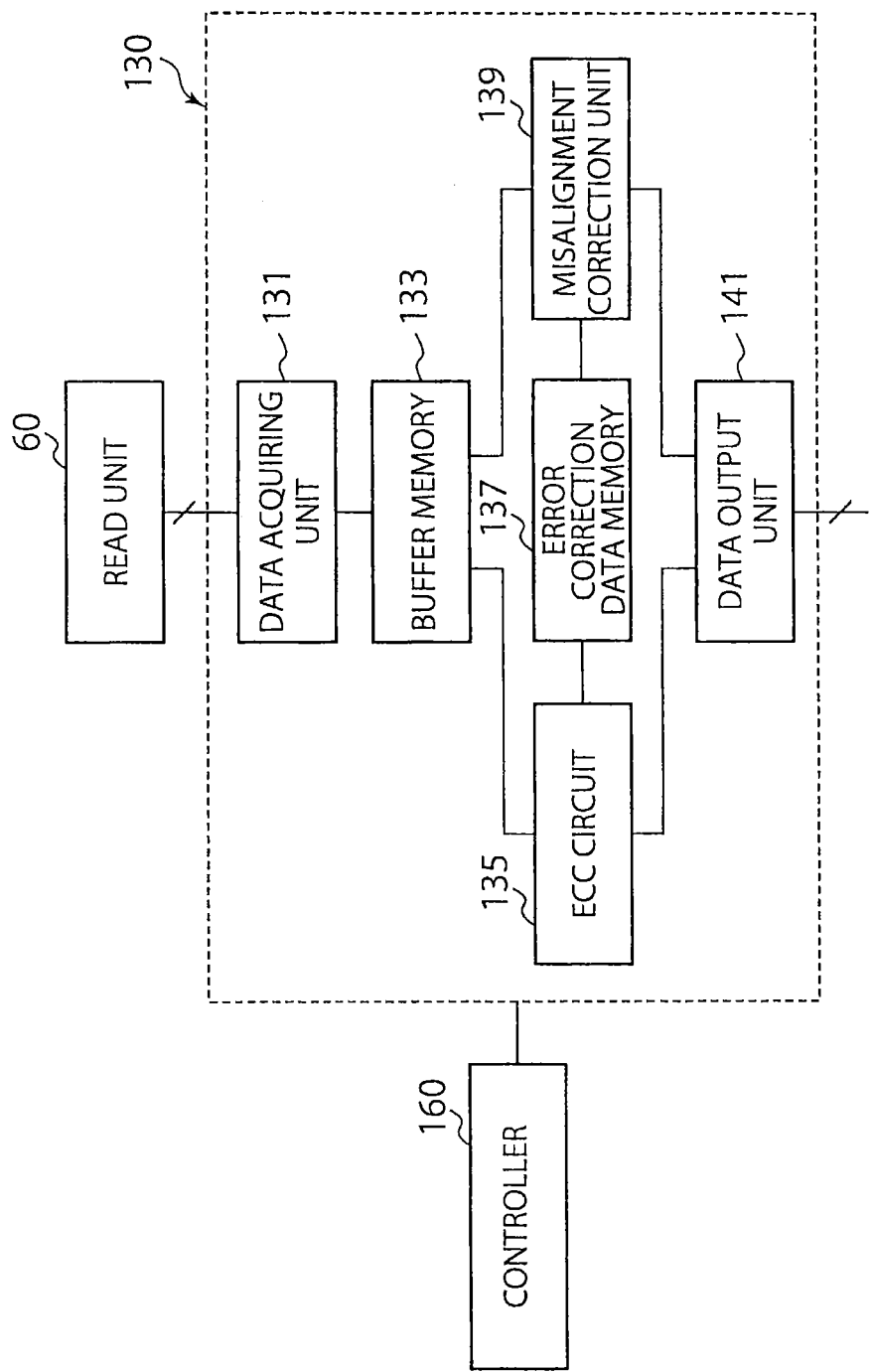
FIG. 6 is a diagram showing the structure of a read control unit.

FIG. 6 shows an example of the structure of the read control unit 130. The read control unit 130 of this example includes a data acquiring unit 131, a buffer memory 133, an error correction circuit 135 (for example Error Checking and Correcting (ECC) circuit 135), an error correction data memory 137, a misalignment correction unit 139, and a data output unit 141. The data acquiring unit 131, the buffer memory 133, the ECC circuit 135, the error correction data memory 137, the misalignment correction unit 139, and the data output unit 141 of the read control unit 130 are controlled by the controller 160. The read control unit 130 operates as follows.

Figure 7:
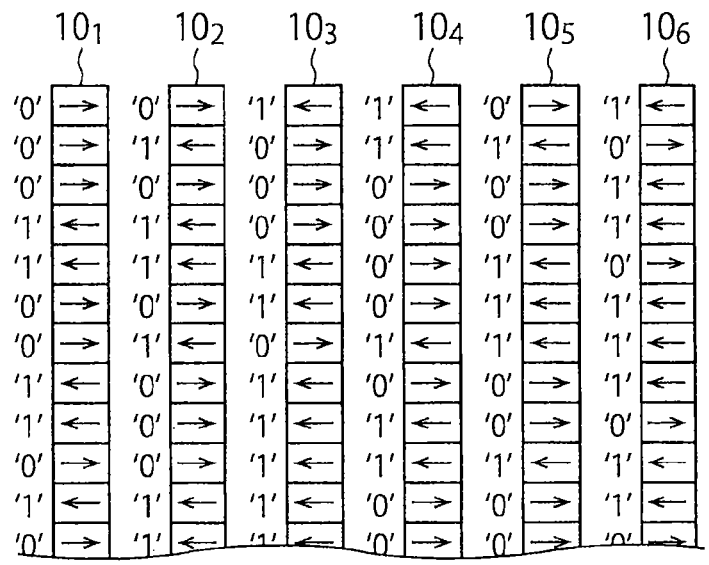
FIG. 7 is an explanatory diagram illustrating the read operation.

First, data read by the read unit 60 corresponding to each magnetic nanowire $10_i$ (i=1, . . . , N) are acquired by the data acquiring unit 131 in response to a command from the controller 160. For example, data stored in the magnetic nanowires $10_1$-$10_6$ shown in FIG. 7 are sequentially acquired by the data acquiring unit 131 from the top data. The read unit 60 is disposed on the top of each of the magnetic nanowires $10_1$-$10_6$ in FIG. 7. The data (magnetization directions) stored in each magnetic nanowire are perpendicular to the film plane of the magnetic nanowire. In order to clarify the directions of magnetization (directions of arrows) in the drawings, the directions are shown to be parallel to the film planes (in the lateral direction in the drawings) in FIGS. 7-12. The magnetization represented by an arrow toward the right corresponds to a data "0," and the magnetization represented by an arrow toward the left corresponds to a data "1."

The acquired data are sent to the buffer memory 133, and stored in units of several rows (bits). For example, the upper portion of FIG. 8 shows that the buffer memory 133 stores four rows (four bits) of data read from each of the magnetic nanowires $10_1$-$10_6$, and that the bottom portion of FIG. 8 shows that the data in the magnetic nanowires $10_1$-$10_6$ on are shifted by four rows (four bits) from the state shown in FIG. 7.

Errors in the data stored in the buffer memory 133 are corrected by the ECC circuit 135. The data in the same row in the buffer memory 133 collectively have a meaning. Therefore, an error correction is performed in the units of the meaningful data. An example of the unit of data stored in the buffer memory 133 to be error-corrected by the ECC circuit 135 is diagonally shaded in FIG. 8 (the third row).

Figure 8:
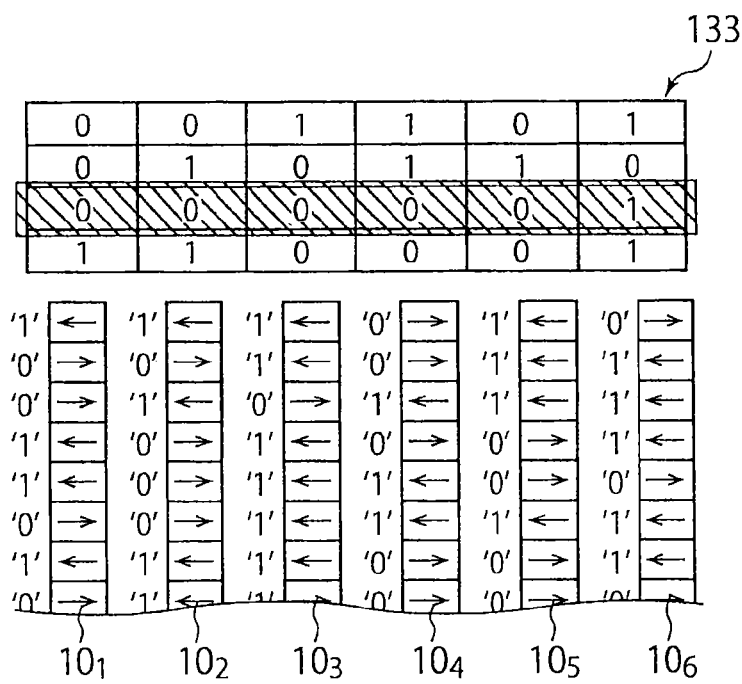
FIG. 8 is an explanatory diagram illustrating the read operation.

As can be understood from FIGS. 7 and 8, no error to be corrected is found in the data stored in the buffer memory 133 shown in FIG. 8. In this case, the data stored in the buffer memory 133 are not corrected by the ECC circuit 135, and sent to the data output unit 141 and outputted to the outside of the read control unit 130 from the data output unit 141.

The error correction by the ECC circuit 135 will be described next.

Figure 9:
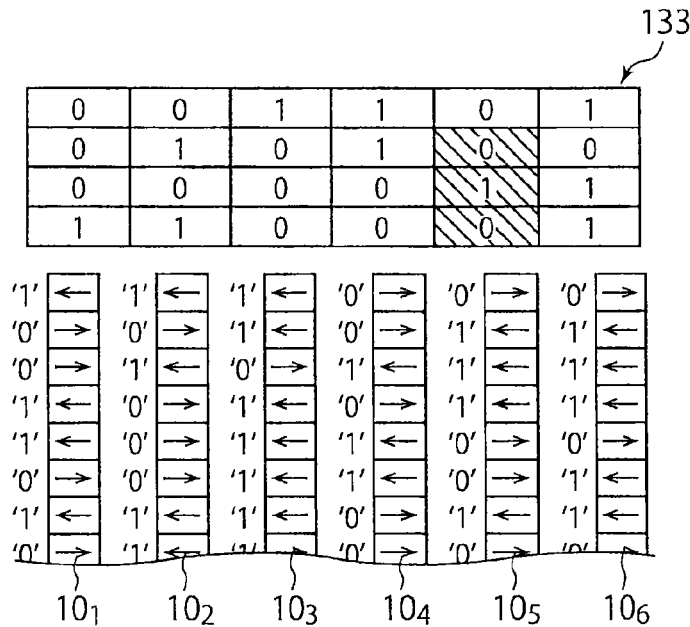
FIG. 9 is an explanatory diagram illustrating the read operation.

The upper portion of FIG. 9 shows the data stored in the buffer memory 133 after the data of the magnetic nanowires $10_1$-$10_6$ shown in FIG. 7 are read for the first to the fourth rows by means of the read units 60 corresponding to the respective magnetic nanowires. Errors are found for the data on and after the second row. The errors are caused by the delay in the shift operation in the magnetic nanowire $10_5$ as compared with the shift operations of the other magnetic nanowires. The data for which errors are found in the read operation are diagonally shaded in FIG. 9. The data in the first row of the magnetic nanowire $10_5$ is correctly read and stored in the buffer memory 133. The data in the second to fourth rows read and stored are those of the first to third rows of the magnetic nanowire $10_5$, which are read due to the delay in the shift operation of the magnetic nanowire $10_5$. The data in the fourth row in the buffer memory 133 for the magnetic nanowire $10_5$ is that of the third row of the magnetic nanowire $10_5$ shown in FIG. 7, but is correct since the data in the fourth row and the data in the third row of the magnetic nanowire $10_5$ are the same. Therefore, the data in the fourth row of the magnetic nanowire $10_5$ stored in the buffer memory 133 is not corrected by the ECC circuit 135.

The data of the magnetic nanowires other than the magnetic nanowire $10_5$ are correctly read and stored in the buffer memory 133. The lower portion of FIG. 9 shows the data stored in the magnetic nanowires $10_1$-$10_6$ after the data of the first to fourth rows are read from the magnetic nanowires $10_1$-$10_6$ shown in FIG. 7. The data shown on the top of the magnetic nanowire $10_5$ in the lower portion of FIG. 9 is that of the fourth row, which should have been read but has not yet been read.

Figure 10:
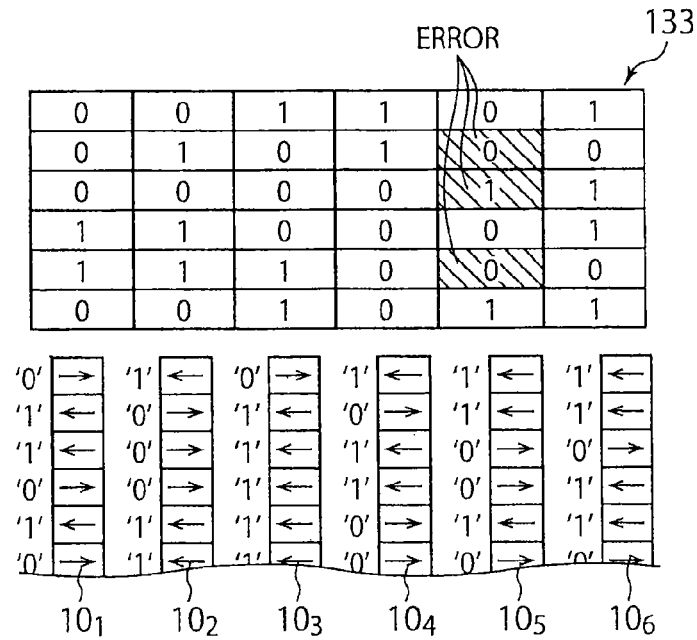
FIG. 10 is an explanatory diagram illustrating the read operation.

If there is an error in the data stored in the buffer memory 133 as described above, the error is corrected by the ECC circuit 135, and the corrected data is sent by the ECC circuit 135 to the data output unit 141, and outputted to the outside of the read control unit 130 by the data output unit 141. If the ECC circuit 135 corrects errors, the total number of times of the error corrections performed on the respective magnetic nanowires is stored in the error correction data memory 137. Furthermore, the locations of the errors in the data stored in the buffer memory 133 are stored in the error correction data memory 137. The upper portion of FIG. 10 shows that data in six rows (for six bits) are read from each of the magnetic nanowires $10_1$-$10_6$ shown in FIG. 7 and stored in the buffer memory 133. The upper portion shows that the shift operation of the magnetic nanowire $10_5$ is slower than the shift operations of the other magnetic nanowires, and that there are errors in the second, third, and fifth rows of the data read from the magnetic nanowire $10_5$. The three cells including the errors are diagonally shaded. The lower portion of FIG. 10 shows the data stored in the magnetic nanowires $10_1$-$10_6$ after the data of the first to sixth rows are read from the magnetic nanowires $10_1$-$10_6$ shown in FIG. 7.

During a parallel read operation for reading the data from the magnetic nanowires, if the total number of error corrections performed on the read data of at least one of the magnetic nanowires reaches a predetermined number (for example, three), a command is sent from the error correction data memory 137 to the misalignment correction unit 139. In response to the sent command, the misalignment correction unit 139 corrects the data stored in the buffer memory 133 in the following manner.

Figure 11A:
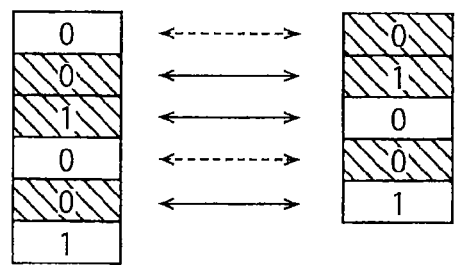
FIG. 11A is an explanatory diagram illustrating the read operation.

First, the data stored in the buffer memory 133 are shifted forward or backward using the error portions stored in the error correction data memory 137, and the data before and after the shifting are compared with each other. For example, the left portion of FIG. 11A shows the data of the six rows read from the magnetic nanowire $10_5$, and the right portion shows the data of the five rows obtained by shifting the data of the six rows upward by one row. In FIG. 11A, three data are reversed in the corresponding rows (indicated by the solid lines), and two data are unchanged (indicated by the broken lines). The diagonally-shaded portions in FIG. 11A include data with errors that are reversed after the shifting.

Figure 11B:
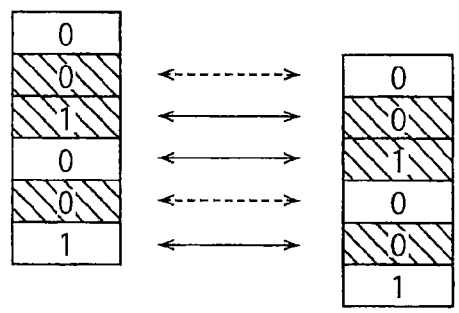
FIG. 11B is an explanatory diagram illustrating the read operation.

The left portion of FIG. 11B shows the data in the six rows read from the magnetic nanowire $10_5$, and the right side shows the data of the six rows obtained by shifting the data of the six rows downward by one row. In FIG. 11B, three data are reversed in the corresponding rows (indicated by the solid lines), and two data are unchanged (indicated by the broken lines). It can be understood that one of the data in the diagonally-shaded error portions is reversed, and the other two are unchanged in FIG. 11B.

As can be understood from FIGS. 11A and 11B, the data of the magnetic nanowire $10_5$ stored in the buffer memory 133 become correct by being shifted upward by one row. The shifting direction (moving direction) and the number of the data to be moved of the magnetic nanowire $10_5$ stored in the buffer memory 133 are determined by the misalignment correction unit in this manner.

After the moving direction and the number of data with errors of the magnetic nanowire $10_5$ to be moved are determined by the misalignment correction unit 139, the data stored in the buffer memory 133 are not corrected by the ECC circuit 135, but the misalignment thereof are corrected by the misalignment correction unit 139. Thereafter, the data are sent to the data output unit 141, and outputted to the outside of the read control unit 130 by the data output unit 141.

Figure 12:
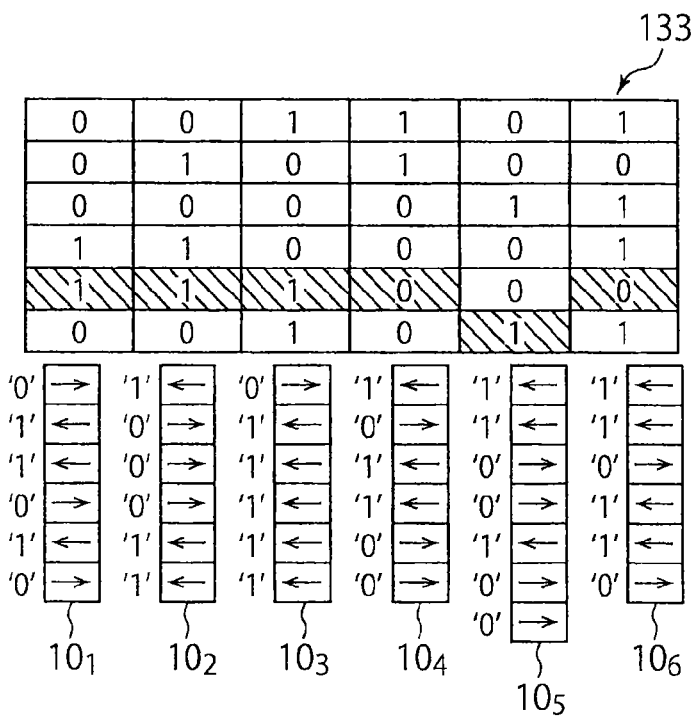
FIG. 12 is an explanatory diagram illustrating the read operation.

The data to be corrected by the misalignment correction unit 139 will be described with reference to FIG. 12. The upper portion of FIG. 12 shows the data in six rows of the magnetic nanowires $10_1$-$10_6$ shown in FIG. 7 read and stored in the buffer memory 133. The lower portion of FIG. 12 shows the data stored in the magnetic nanowires $10_1$-$10_6$ after those of the first to sixth rows are read. The data of the magnetic nanowire $10_5$ stored in the buffer memory 133 shown in the upper portion of FIG. 12 are corrected by being shifted upward by one row relative to the data of the other magnetic nanowires, except the data in the first row. For example, the misalignment correction unit 139 corrects the data so that the data in the six row of the magnetic nanowire $10_5$ and the data in the fifth row of the other magnetic nanowires are put into the same row as shown in the upper portion of FIG. 12, and sends these data to the data output unit 141.

Figure 13:
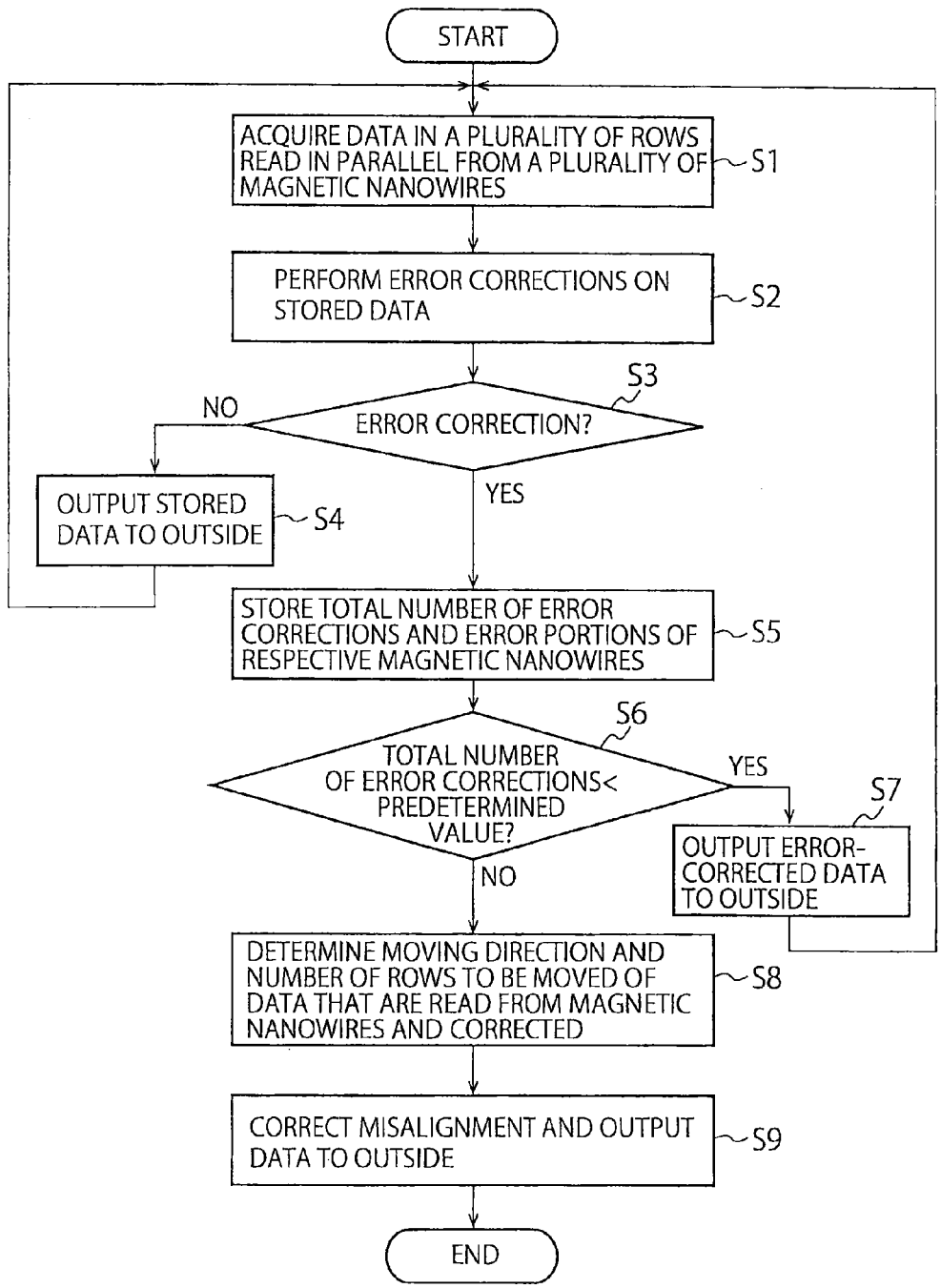
FIG. 13 is a flow chart showing the process of operating the read control unit.

FIG. 13 shows the procedure of the operation performed by the read control unit 130.

First, data of a plurality of rows read from a plurality of magnetic nanowires in a parallel manner are acquired by the data acquiring unit 131, and stored in the buffer memory 133 (S1 of FIG. 13). Subsequently, error correction is performed on the stored data by the ECC circuit 135 (S2 of FIG. 13). If there is no error correction, the stored data are outputted to the outside by the data output unit 141, and then the process returns to the step S1 (S3, S4 of FIG. 13).

If an error correction is performed, the total number of error corrections and the error portions of the respective magnetic nanowires are stored in the error correction data memory 137 (S3, S5 of FIG. 13).

If the total number of error corrections is less than a predetermined value, the error-corrected data are outputted to the outside by the data output unit 141 (S6, S7 of FIG. 13).

If the total number of error corrections reaches the predetermined value, the moving direction and the number of rows by which the moving is performed are determined by the misalignment correction unit 139 based on the data stored in the error correction data memory 137 (S8 of FIG. 13). The misalignment of the read data is corrected by the misalignment correction unit 139 based on the determined moving direction and the number of rows by which the moving is performed, and the resulted data are outputted to the outside by the data output unit 141 (S9 of FIG. 13). Thereafter, the data read from the magnetic nanowires in a parallel manner and acquired are not corrected by the ECC circuit 135 but the misalignment thereof are corrected by the misalignment correction unit 139 and outputted to the outside by the data output unit 141.

In the above descriptions, the shift control unit 110, the write control unit 120, and the read control unit 130 are controlled based on the commands from the controller 160. However, a controller may be disposed to each of these control units. In this case, data of a plurality of rows in a plurality of magnetic nanowires may be read in a parallel manner by causing the read control unit 130 to cooperate with the shift control unit 110, for example, to repeatedly perform the shift operation on the domain walls of the magnetic nanowires and repeatedly perform the read operation to read data from the magnetic nanowires.

As described above, the embodiment is capable of correcting the misalignment in data read in parallel caused by the difference in the shifting speed of the magnetic nanowires, and outputting the corrected data to the outside. This improves the reliability of the read data.

Although the direction of magnetization of the magnetic nanowires in the above descriptions is perpendicular to the film plane of each magnetic nanowire, the same effect can be obtained even if the direction of magnetization is parallel to the film plane.

The scope of the phrases "perpendicular to the film plane" and "parallel to the film plane" herein may include the fluctuations in the direction caused in the manufacturing process.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:
 a first magnetic nanowire and a second magnetic nanowire;
 a read unit configured to read data from the first and second magnetic nanowires, the data including first data corresponding to the first magnetic nanowire and second data corresponding to the second magnetic nanowire;
 a shift control unit configured to shift domain walls in the first and second magnetic nanowires; and
 a read control unit configured to
  control the read unit to read the data from the first and second magnetic nanowires in parallel,
  store the data in parallel, and
  when the first data is delayed or advanced as compared to the second data, determine a misalignment in the data and correct the first data based on the misalignment.

2. The memory system according to claim 1, wherein the read control unit includes:
 a first memory in which the first and second data read in parallel are stored;
 an error correction circuit configured to perform an error correction on the first data in the first memory;
 a second memory configured to store a total number of error corrections and locations of error corrections with respect to the first data in the first memory; and
 a misalignment correction unit configured to determine a moving direction and a number of data to be moved based on the total number of error corrections and the locations of error corrections stored in the second memory, correct the first data in the first memory based on the determined moving direction and the determined number of data to be moved, and output the first data corrected and the second data.

3. The memory system according to claim 2, wherein the error correction circuit performs the error correction in units of the data read in parallel.

4. The memory system according to claim 2, wherein when no error correction is performed by the error correction circuit, the read control unit outputs the first and second data in the first memory.

5. The memory system according to claim 2, wherein when the total number of error corrections performed on the first data is less than a certain value, the read control unit outputs the first data on which the error correction is performed by the error correction circuit and the second data.

6. The memory system according to claim 2, wherein when the number of error corrections performed on the first data is equal to or more than a certain value, the read control unit outputs the first data corrected by the misalignment correction unit and the second data.

7. The memory system according to claim 1, further comprising a first and second write units, the first and second write units being configured to write the data to the first and second magnetic nanowires respectively, each of the first and second write units including a magnetic electrode and an intermediate layer disposed between the magnetic electrode and each of first and second magnetic nanowires, the magnetic electrode containing a magnetic material.

8. The memory system according to claim 1, wherein the read unit includes a magnetic electrode and a tunnel barrier layer, the magnetic electrode containing a magnetic material, the tunnel barrier layer being disposed between the magnetic electrode and one of the magnetic nanowires.

9. A method of controlling a magnetic memory with first and second magnetic nanowires, the method comprising:
 shifting domain walls in the first and second magnetic nanowires;
 reading data in parallel from the first and second magnetic nanowires for each shifting, the data including first data corresponding to the first magnetic nanowire and second data corresponding to the second magnetic nanowire;
 storing the data in parallel; and
 when the first data is delayed or advanced as compared to the second data, determining a misalignment in the data and correcting the first data based on the misalignment.

10. The method according to claim 9, wherein the correcting includes:

performing an error correction on the first data;

storing a total number of error corrections and locations of error corrections for the first magnetic nanowire;

determining a moving direction and a number of data to be moved based on the stored total number of error corrections and the stored locations of error corrections; and correcting the first data to correct the determined moving direction and the determined number of data to be moved, and outputting the first data corrected and the second data.

11. The method according to claim 10, wherein the error correction is performed in units of the data read in parallel.

12. The method according to claim 10, further comprising outputting the first and second data when no error correction is performed on the first data.

13. The method according to claim 10, further comprising outputting the first data on which the error correction is performed when the total number of error corrections on the first data is less than a certain value.

14. The method according to claim 10, the correcting of the first data further comprising outputting the first data corrected when the total number of error corrections on the first data is equal to or more than a certain value.

15. A control device configured to control a magnetic memory including first and second magnetic nanowires and a read unit that reads data from the first and second magnetic nanowires, the control device comprising:

a shift control unit configured to shift domain walls in the first and second magnetic nanowires; and a read control unit configured to control the read unit to read the data from the first and second magnetic nanowires in parallel, store the data read in parallel, the data including first data corresponding to the first magnetic nanowire and second data corresponding to the second magnetic nanowire, and when the first is delayed or advanced as compared to the second data, determine a misalignment in the data and correct the first data based on the misalignment.

16. The control device according to claim 15, wherein the read control unit includes:

a first memory in which the first and second data read in parallel are stored;

an error correction circuit configured to perform an error correction on the first data in the first memory;

a second memory configured to store a total number of error corrections and locations of error corrections with respect to the first data in the first memory; and a misalignment correction unit configured to determine a moving direction and a number of data to be moved based on the total number of error corrections and the locations of error corrections stored in the second memory, correct the first data in the first memory based on the determined moving direction and the determined number of data to be moved, and output the first data corrected and the second data.

17. The control device according to claim 16, wherein the error correction circuit performs the error correction in units of the data read in parallel.

18. The control device according to claim 16, wherein when no error correction is performed by the error correction circuit, the read control unit outputs the first and second data in the first memory.

19. The control device according to claim 16, wherein when the total number of error corrections performed on the first data is less than a certain value, the read control unit outputs the first data on which the error correction is performed by the error correction circuit and the second data.

20. The control device according to claim 16, wherein when the number of error corrections performed on the first data is equal to or more than a certain value, the read control unit outputs the first data corrected by the misalignment correction unit and the second data.

* * * * *